(12) United States Patent
Fritsch et al.

(10) Patent No.: US 7,615,414 B2
(45) Date of Patent: Nov. 10, 2009

(54) DENTAL INTRAORAL RADIOLOGICAL IMAGE SENSOR WITH A FIBER-OPTIC PLATE

(75) Inventors: Lionel Fritsch, St Etienne de Crossey (FR); Pierre Cambou, Grenoble (FR)

(73) Assignee: E2V Semiconductors (FR)

( * ) Notice: Subject to any disclaimer, the term of this patent is extended or adjusted under 35 U.S.C. 154(b) by 194 days.

(21) Appl. No.: 11/994,402

(22) PCT Filed: Jun. 29, 2006

(86) PCT No.: PCT/EP2006/063675
§ 371 (c)(1),
(2), (4) Date: Dec. 31, 2007

(87) PCT Pub. No.: WO2007/003571
PCT Pub. Date: Jan. 11, 2007

(65) Prior Publication Data
US 2009/0224161 A1    Sep. 10, 2009

(30) Foreign Application Priority Data
Jul. 1, 2005  (FR) ................... 05 07034

(51) Int. Cl.
*H01L 21/00* (2006.01)
*G01J 5/02* (2006.01)
*H01L 27/15* (2006.01)
*H01L 29/26* (2006.01)
*H01L 31/12* (2006.01)
*H01L 33/00* (2006.01)

(52) U.S. Cl. .......... 438/113; 438/59; 438/106; 250/339.02; 257/80; 257/E21.502

(58) Field of Classification Search ............ 438/57, 438/59, 106, 110, 113; 250/294, 338.1, 338.4, 250/339.02, 316.1; 257/80, E21.502
See application file for complete search history.

(56) References Cited

U.S. PATENT DOCUMENTS 4,900,930 A    2/1990    Takiguchi et al.

(Continued)

FOREIGN PATENT DOCUMENTS

EP    1 300 692    4/2003

(Continued)

*Primary Examiner*—Alexander G Ghyka
*Assistant Examiner*—Seahvosh J Nikmanesh
(74) *Attorney, Agent, or Firm*—Lowe Hauptman Ham & Berner, LLP

(57) ABSTRACT

The invention relates to dental radiological image sensors for intraoral use. What is described is a method of fabricating an image sensor, comprising steps for the collective production of a structure combining a semiconductor wafer (12), bearing a series of image detection circuits, and a fiber-optic plate (20) fixed to one face of the wafer, the semiconductor wafer being thinned in a step subsequent to the formation of the image detection circuits on the wafer, and external access contact pads (28) are produced on that face of the wafer which is not fixed to the fiber plate, said contact pads being for controlling the circuits and for receiving image signals coming from the sensor, the fiber-optic plate having a thickness such that it provides most of the mechanical integrity of the structure once the wafer has been thinned, and to do so right to the end of the collective fabrication, the assembled structure consisting of the wafer and the plate being subsequently diced into individual chips.

19 Claims, 5 Drawing Sheets

U.S. PATENT DOCUMENTS

| | | | |
|---|---|---|---|
| 5,835,142 A * | 11/1998 | Nakamura et al. | 348/335 |
| 6,445,767 B1 * | 9/2002 | Karellas | 378/98.8 |
| 6,717,174 B2 * | 4/2004 | Karellas | 250/582 |
| 6,750,072 B2 * | 6/2004 | Buchanan et al. | 438/24 |
| 2002/0090184 A1 * | 7/2002 | Sayag | 385/120 |
| 2003/0031435 A1 | 2/2003 | Yeh et al. | |
| 2003/0164453 A1 | 9/2003 | Nakata et al. | |
| 2007/0053498 A1 * | 3/2007 | Mandelkern et al. | 378/184 |

FOREIGN PATENT DOCUMENTS

| | | |
|---|---|---|
| EP | 1 427 020 | 6/2004 |
| FR | 2 815 140 | 4/2002 |
| JP | 05-054840 | 3/1993 |
| JP | 05 054840 | 3/1993 |

* cited by examiner

DENTAL INTRAORAL RADIOLOGICAL IMAGE SENSOR WITH A FIBER-OPTIC PLATE

CROSS-REFERENCE TO RELATED APPLICATIONS

The present Application is based on International Application No. PCT/EP2006/063675 filed on Jun. 29, 2006, which in turn corresponds to French Application No. 05 07034 filed on Jul. 1, 2005, and priority is hereby claimed under 35 USC §119 based on these applications. Each of these applications are hereby incorporated by reference in their entirety into the present application.

FIELD OF THE INVENTION

The invention relates to small-sized high-resolution dental radiological image sensors and it applies in particular, but not exclusively, to intraoral radiological image sensors.

BACKGROUND OF THE INVENTION

Existing intraoral dental image sensors are not always optimized from the standpoint of compactness owing to the fact that it is necessary to find compromises between fabrication cost and the desired optical performance, and that these compromises must be made to the detriment of other parameters, such as size, whether this be their length, their width or their thickness. Now, size is an essential parameter since the image sensor has to be introduced into a patient's mouth. Each millimeter or fraction of a millimeter saved, in each of the three dimensions, for a given image acquisition surface, represents a significant progress.

Existing radiological image sensors are usually produced in the following manner: a series of individual, visible image detection chips on a silicon wafer by a number of operations in which insulating, conducting and semiconductor layers are deposited and etched, and doping operations, etc., all these operations being carried out starting from a front face of the wafer. After collective fabrication on the wafer, the wafer is diced into individual chips, and the chips are each mounted on a support. Conducting areas on the chip are connected to conducting areas on the support by wires using the technique of wire bonding. Next, in the case of radiology, a scintillator is deposited (in general bonded) to the front face of the silicon chip. The scintillator is designed to convert the incident X-rays into visible radiation at a wavelength at which the image sensor is sensitive.

It has already been proposed to interpose, between the scintillator and the silicon chip, a flat fiber-optic plate having a thickness of a few microns, the purpose of which is to attenuate (by simple absorption) the residual X-radiation that has passed through the scintillator without being converted into visible light. This is because the residual X-rays tend to be generated in the silicon from parasitic electrons that represent more noise than the useful signal, and it is desirable to eliminate them. The fiber plate attenuates the X-rays, but it does not attenuate the visible light that has been emitted by the scintillator. The resolution of the visible image generated in the scintillator is preserved by the fiber-optic plate and is repeated on the sensitive surface of the sensor—this is its great advantage.

In this case, it is not a simple scintillator wafer that is bonded to the silicon chip but a fiber-optic plate coated with a scintillating layer. The scintillating layer may be a layer of cesium iodide deposited on the plate, or else, more usually, it is a carbon film coated with cesium iodide that is bonded to the plate by a transparent adhesive interposed between the cesium iodide and the plate. Materials other than cesium iodide may be used (sheets of plastic filled with gadolinium oxysulfide, etc.).

The devices fabricated up until now are not optimized in terms of the dimensions of the image sensor.

SUMMARY OF THE INVENTION

The object of the invention is to use a fiber-optic plate in a novel manner, which makes it possible to facilitate the fabrication and to improve the performance of the sensors, especially as regards their size, both in terms of thickness and in lateral dimensions. This fiber-optic plate can be used in the case of a radiological image sensor associated with a scintillator.

According to the invention, what is proposed is a method of fabrication for the collective production of a structure combining a semiconductor wafer, bearing a matrix of photosensitive detectors integrated into the wafer, and a fiber-optic plate fixed by wafer bonding (i.e. molecular adhesion with no adhesive applied) to one face of the wafer, the semiconductor wafer being thinned in a step subsequent to the formation of the image detection circuits on the wafer, and external access contact pads are produced on that face of the wafer which is not fixed to the fiber plate, said contact pads being for controlling the circuits and for receiving image signals coming from the sensor, the fiber-optic plate having a thickness such that it provides most of the mechanical integrity of the structure once the wafer has been thinned, and does so right to the end of the collective fabrication, the assembled structure consisting of the wafer and the plate being subsequently diced into individual chips.

In principle, the dicing into chips is carried out by sawing, and the sawing operation cuts the thin wafer and the fiber plate simultaneously, along one and the same dicing line. Thus the device benefits from the protection against residual X-rays conferred by the fiber-optic plate.

The fiber plate is fixed to the wafer by wafer bonding (i.e. molecular adhesion without adhesive being applied) between two highly planar surfaces. The highly planar surfaces are obtained when this is necessary by depositing a planarization layer that embeds the relief and by chemical and/or mechanical polishing until a very low roughness (equal to or less than 1 nanometer if possible) is obtained.

Thus, according to the invention, a fiber-optic plate is used as support for a thinned semiconductor wafer that would be unable to be self-supporting after thinning. The scintillator is preferably bonded to the plate while the collective fabrication process is still continuing, that is to say before division into individual chips. The plate plays its role of protecting against X-rays, but it was put into position during the collective steps. The silicon wafer may be greatly thinned, on the one hand to reduce the overall thickness of the chip, so as to make it possible to produce contact pads on the accessible face when vias have to be produced between the two faces of the wafer, and, on the other hand, possibly to improve the optical performance of the sensor. The contact pads of the chip are located on one face of the semiconductor wafer, the one which is on the opposite side to the face bonded to the fiber plate, thereby avoiding complex dicing operations in order to gain free access to the pads. Complex dicing would in fact be necessary if the access pads were located on the same side as the bonded face, on the periphery of the plate. It will be seen later how the invention reduces the final lateral dimensions of the sensor. Lastly, the wafer bonding, made possible between highly planar facing surfaces, obviates the interposition, between the plate and the chip, of a transparent adhesive, the thickness, bubbles and defects of which would result in a loss of quality of the sensor.

The invention also relates to a novel and small-sized image sensor, comprising a chip formed from a superposition of a fiber-optic plate and a semiconductor wafer, fixed to the wafer by wafer bonding with no adhesive applied, having a thickness smaller than the thickness of the plate and being less than 30 microns, in which wafer a matrix of photosensitive zones and associated electronic circuits are formed, the wafer having, on its face not bonded to the fiber plate, external access contact pads for controlling the sensor and for receiving image signals coming from the matrix.

Between the semiconductor wafer and the plate there are only planarization layers.

In the preceding paragraph, the word "semiconductor wafer" was used as opposed to the word "semiconductor chip" that is generally used, in order to convey the fact that there is no longer a rigid chip as in the prior art but instead an extremely thin and non-rigid wafer, the mechanical integrity of which is essentially provided by the fiber-optic plate. The thickness of the wafer is at most 30 microns and may even be much less (only a few microns). The thickness of the fiber plate is in principle a few hundred microns, the criterion being that it be able to provide mechanical integrity during the collective fabrication. Exceptionally, the thickness of the plate may drop to about 100 microns.

As will be seen, one particular feature of the sensor according to the invention is that the peripheral edge of the plate exactly overhangs the peripheral edge of the semiconductor wafer in which the image sensor is formed. In addition, when the wafer/plate structure is mounted on a support (package base, or hybrid circuit on ceramic, or printed circuit), the support does not need to be laterally offset in relation to the structure.

The method according to the invention has two main modes of implementation depending on whether the plate is fixed to the front face or to the rear face of the semiconductor wafer. The front face of the wafer is the face from which the electronic circuits of the chips (photosensitive matrices and associated circuits) are formed.

In the first mode of implementation, it is the front face that is bonded to the plate, and the contact pads are therefore on the rear face of the thinned wafer. Conducting vias pass through the thickness of the thinned wafer in order to connect the pads to the electronic circuits. The method of fabricating a compact image sensor then comprises the following steps: starting from a semiconductor wafer intended for the simultaneous production of several individual sensors, a number of matrices of photosensitive zones and of associated electronic circuits are produced from a front face of the wafer by successive layer deposition and etching steps; the front face is planarized, as is also a front face of a fiber-optic plate of sufficient thickness to ensure mechanical integrity of the wafer during the rest of the fabrication thereof, before being diced into individual chips; the plate is bonded via its planarized front face to the planarized front face of the wafer, the bonding being carried out by wafer bonding without interposition of an adhesive; most of the thickness of the semiconductor wafer is removed by machining the rear face thereof; on the rear face of the thinned wafer, external contact pads are formed that allow the sensor to be controlled and the image signals to be received, these pads being electrically connected, through the thickness of the thinned wafer, to the circuits produced on the front face of the wafer; and, subsequently, the wafer is diced into individual chips.

In the second mode of implementation, it is the rear face that is bonded to the plate. To do this, a temporary mounting substrate, preferably made of silicon, is used; the front face of the semiconductor wafer is bonded to the temporary substrate; the wafer is thinned via its rear face, the temporary substrate providing its mechanical integrity during this operation; the assembly thus formed is bonded, by the rear face of the wafer, to a fiber-optic plate; and the temporary substrate is removed, the plate becoming a definitive substrate that provides the mechanical integrity of the thinned wafer. The contact pads are then located on the front face of the wafer, now accessible after the temporary substrate has been removed. In this second mode, the method of fabricating a compact image sensor therefore comprises the following steps: starting from a semiconductor wafer intended for the simultaneous production of several individual sensors, a number of matrices of photosensitive zones and of associated electronic circuits are produced from a front face of the wafer by successive layer deposition and etching steps, and also produced are external access contact pads allowing the sensor to be controlled and image signals to be received; the front face of the wafer is bonded to the front face of a temporary mounting substrate, and most of the thickness of the wafer is removed by machining the rear face of the latter; the rear face of the thinned wafer is planarized, as is a front face of a fiber-optic plate of sufficient thickness to provide the wafer with mechanical integrity during the rest of its fabrication before being diced into individual image sensors, and the plate is bonded by its planarized front face to the planarized rear face of the wafer, the bonding being carried out by wafer bonding with no adhesive applied; the temporary mounting substrate is removed and the external access contact pads are bared; and subsequently, the wafer is diced into individual chips.

Still other advantages of embodiments according to the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE DRAWINGS

Figure 1:
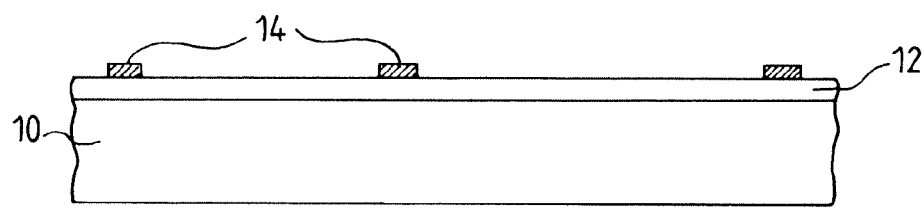
FIG. 1 shows a semiconductor wafer on the front face of which image detection circuits have been formed.

FIG. 1 shows schematically a semiconductor wafer 10. The wafer is conventionally a semiconductor substrate, the front face of which bears a lightly doped epitaxial layer 12 in which visible image detection circuits (not shown) are formed, these being intended to be subsequently diced into individual chips each corresponding to an individual image sensor. Each image detection circuit comprises a photosensitive matrix, associated electronic circuits, interconnections and conducting areas or zones 14 intended to be connected to external connections of the sensor. The external connections are provided for supplying and controlling the electronic circuits of the sensor, and also for receiving the electronic signals representing the images detected by the sensor.

The front face of the wafer (at the top in FIG. 1) is the face from which the conventional operations are carried out, namely the deposition of conducting or semiconductor or insulating layers, the etching of these layers, implantations, etc., making it possible for matrices, the associated circuits and the conducting areas (the latter in general being made of aluminum) to be produced collectively.

A first embodiment of the invention will firstly be described with reference to FIGS. 2 to 9, in which the semiconductor wafer is initially transferred onto a fiber-optic plate before the wafer is thinned.

To do this, the process starts (FIG. 2) with the planarization of the front face of the wafer 10. In practice, since the front surface of the wafer is modeled by the relief left by the successive deposition and etching of layers, the planarization consists in covering the front face of a planarization layer 16 (silicon oxide) a few microns in thickness. This layer masks the relief present on the wafer, after which the surface of the wafer is polished (by chemical-mechanical polishing) so as to acquire a planarity as perfect as possible for the purpose of wafer bonding (bonding with no adhesive applied between two highly planar surfaces). Where possible, the remaining roughness must not exceed 1 nanometer.

A fiber-optic plate 20 is prepared (FIG. 3)—if its surface is not perfectly planar, it may also be planarized like that of the wafer, by depositing a planarization layer 22 followed by polishing.

The fiber plate is then mounted (FIG. 4) on the front face of the wafer by wafer bonding. The planarization layer or layers, if they are provided for achieving the desired planarity, also serve as a barrier to the alkaline metals present in the glass of the fiber plate.

Figure 5:
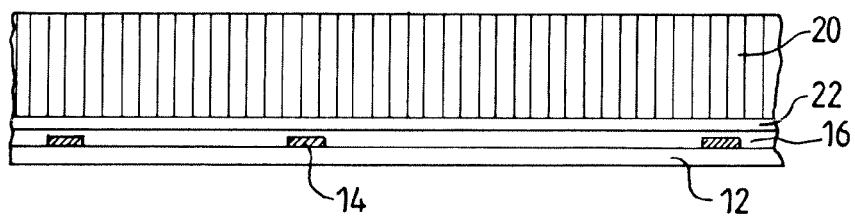
FIG. 5 shows a step of thinning the wafer.
Figure 6:
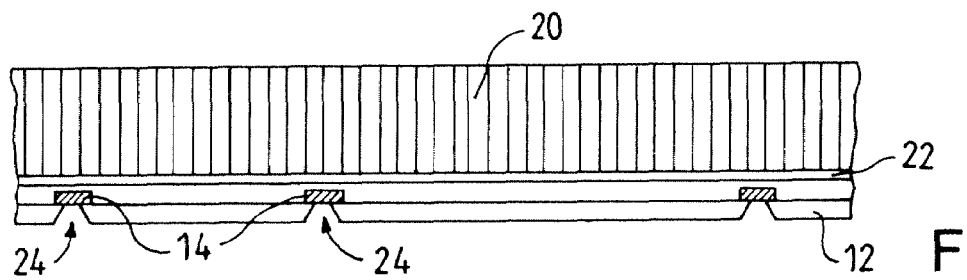
FIG. 6 shows the formation of conducting vias.
Figure 7:
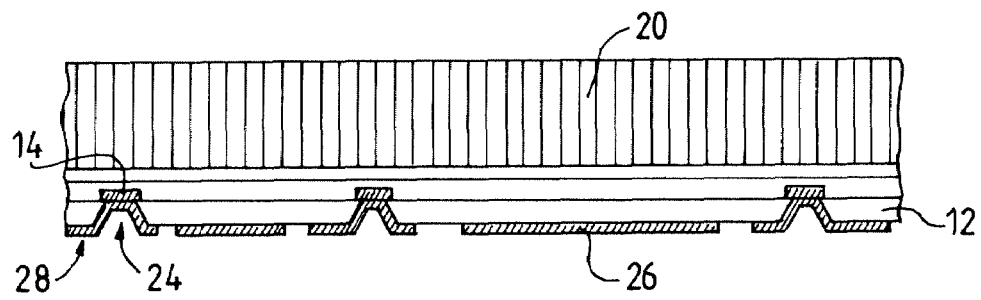
FIG. 7 shows the deposition and etching of a conducting layer on the rear face of the thinned wafer.

The semiconductor wafer is then very greatly thinned (FIG. 5). The thinning leaves behind only a few tens of microns of thickness (a maximum of 30 microns) and in practice it is even possible to leave only a few microns of thickness. The thinning is performed by mechanical machining supplemented with chemical-mechanical polishing. The thinned semiconductor wafer will thereafter be referred to by the reference 12, since in practice it now comprises only the epitaxial layer 12, and even only a fraction of the original epitaxial layer. However, it may also be preferable to retain a small thickness of the original substrate 10.

Throughout the sequence of collective fabrication steps, that is to say until the wafer is divided up into individual sensors, it is the fiber-optic plate that provides the structure with mechanical integrity, the semiconductor wafer no longer being able to do so owing to its very small thickness. The plate has a thickness ranging from 200 to 1000 microns or more. In certain cases, the thickness may however be reduced to 100 microns, but the thickness of the thinned semiconductor wafer is in any case very much smaller than that of the plate.

Next (FIG. 6), access vias 24 are produced, starting from the rear face of the wafer, through the entire thickness of the thinned wafer 12. These vias provide access to the conducting areas 14 or to some of them.

These vias are essentially formed by chemical etching or ion etching of the silicon of the wafer 12, until the conducting areas 14 are bared. The vias serve to establish passages for electrically connecting the metallic areas of the front face to conductors that will now be formed on the rear face. The vias have been shown as trenches having inclined sidewalls with aluminum deposited on these sidewalls. However, if the thinned wafer is only a few microns in thickness, the vias may be formed by narrow trenches having vertical sidewalls, which trenches are etched by plasma etching and filled with aluminum during deposition of the aluminum layer.

There then follows the deposition of an insulating layer (not shown) on the rear face of the trench and then the insulating layer is covered in the bottom of the vias (but not on the sidewalls) by chemical or ion etching. This insulator deposition/etching step avoids subsequent short circuits between vias through the semiconductor layer 12. It is not obligatory if the method of opening the vias means that there is no risk from this point of view. A conducting layer 26 (in practice an aluminum layer) is then deposited on the rear face of the wafer. This will come into contact with the pads 14 inside the vias 24.

An interconnect pattern is etched (FIG. 7) by photolithography in the aluminum layer 26, leaving aluminum in the vias 24 and leaving access contact pads or bonding pads 28 intended for subsequent wire bonding of connection wires. The pads 28 outside the vias are not necessary when the wires may be bonded directly to the bottom of the vias, in which case the bottom of the vias serves as contact pad. The aluminum layer may be protected, at the places that do not need to be accessible for bonding, by a passivation layer (not shown). Instead of wire-bonded wires, conducting bumps may be provided on the pads 28 for "flip-chip" mounting, as will be seen later.

Figure 8:
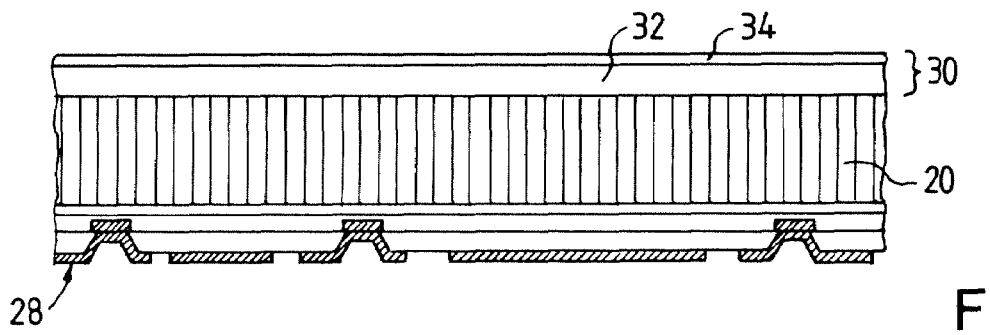
FIG. 8 shows the deposition of a scintillator on the accessible face of the fiber-optic plate.

For a radiological image sensor, a scintillating structure is then deposited on the upper face of the fiber-optic plate (if the fibers themselves are not scintillating). Preferably, the structure is formed by a cesium iodide scintillating layer 32 deposited on a thin carbon film 34, the assembly constituting a flexible scintillating film 30 that is bonded, on the cesium iodide side, to the accessible face of the fiber-optic plate 20, as shown in FIG. 8.

At this stage, the collective fabrication is complete and the plate structure bearing the integrated circuits formed in the semiconductor wafer 12 may be divided up into individual chips, each corresponding to an individual image sensor. These chips are mounted on a support to which they are electrically connected. This support may be the base of a package or a printed circuit on a resin substrate or ceramic substrate bearing other components. The division into individual chips is performed by sawing the collective structure starting from only one face of this structure (preferably the side with the wafer). It is unnecessary to saw both on the top and the bottom along different saw lines.

Figure 9:
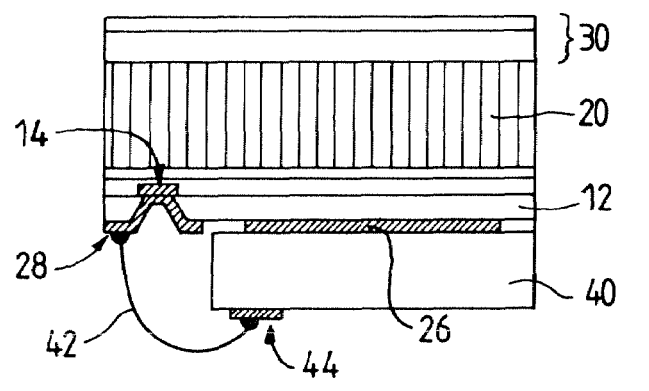
FIG. 9 shows a completed radiological image sensor, comprising the wafer/plate structure diced into an individual chip mounted on a support, to which it is connected by wire-bonded wires.

FIG. 9 shows an individual sensor chip fixed to a support 40. The chip comprises a superposed structure of a fiber-optic plate 20 and a semiconductor wafer element 12 (the plate bearing a scintillator 30 in the case of a radiological image sensor). The peripheral edges of the diced plate are superposed in exact coincidence with the peripheral edges of the semiconductor wafer because each side of the chip was cut by a single saw line, cutting both the plate and the thinned wafer.

The chip is bonded via its rear face (the face bearing the semiconductor wafer and its conducting layer 26) to a first face of the support 40. It is slightly laterally offset from the support, and connection wires 42 are bonded between the conducting pads, such as 28, and conducting areas 44 formed on the other face of the support 40.

Flip-chip mounting is also possible, that is to say the conducting areas 44 are this time on the first face of the support and the pads 28, coated with conducting bumps, are facing the conducting areas 44 and may be soldered directly, pad to pad, to these areas. This is particularly beneficial in terms of footprint and self-alignment. It is possible in particular to produce image acquisition assemblies comprising several juxtaposed chips, with precisely indexed positions, called "focal planes", used especially in scanning radiography.

Figure 10:
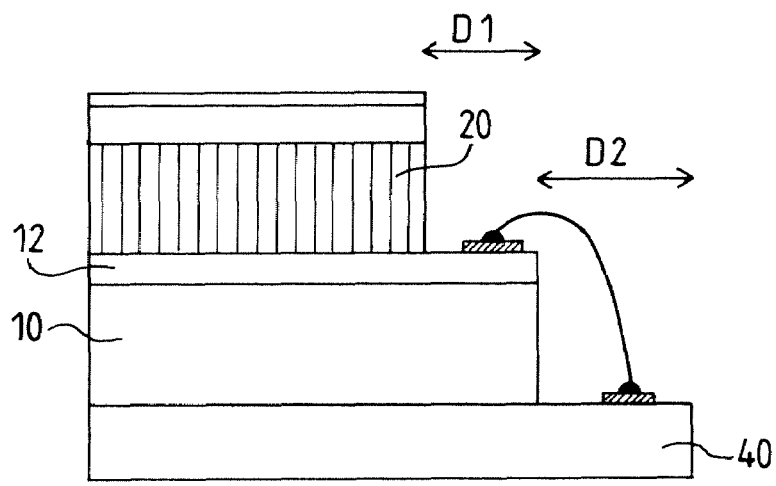
FIG. 10 shows the additional lateral footprint-increasing margins that are necessary in the prior art for mounting a chip on a support.

In both cases, the lateral footprint of the completed sensor is small compared with the prior art (having the same image area). In the prior art as shown in FIG. 10, if there were to be a fiber plate mounted on a conventional semiconductor chip, there would have to be a lateral overhang D1 of the chip relative to the plate (for the bonding pads on the chip) and a lateral overhang D2 of the support relative to the chip (for the bonding areas on the support). In the invention, not only is there no offset of the semiconductor wafer relative to the plate, or vice versa, but there is no need for the chip (wafer+ plate) to be offset relative to the support on which the structure is mounted and bonded. In addition, the margins associated with the fabrication tolerances may be smaller than in the assemblies on individual chips. Finally, the reduction in footprint may also be achieved on the edges of the chips where there are no pads, whereas in the prior art the fiber plate extends beyond these edges, in order to take account of possible mispositioning of the plate.

Thus, in the sensor according to the invention, the fiber-optic plate 20 has a peripheral edge in exact coincidence with the peripheral edge of the semiconductor wafer 12 that remains. The scintillating structure 30 also has a peripheral edge in exact coincidence with the edge of the plate, since it was positioned during the collective fabrication before dicing.

The completed sensor, which can be seen in FIG. 9, is intended to be illuminated by the X-rays arriving from the top. The photosensitive matrix on thinned semiconductor substrate is illuminated by the light from the scintillator via its front face side, contrary to what occurs normally in the case of image sensors with a thinned substrate.

FIGS. 11 to 16 show a second embodiment of the sensor according to the invention. In this second embodiment, the photosensitive matrix is illuminated via the rear of the wafer.

The fabrication starts with a semiconductor wafer on which, as was explained with reference to FIG. 1, all the operations needed to produce the photosensitive matrices and their associated circuits, including the conducting interconnects, are carried out collectively.

However, it should be noted that, unlike the embodiment shown in FIGS. 1 to 9, metallic areas 14 are provided which will serve directly as external contact pads for connection to the outside. In the first embodiment, as may be seen in FIG. 9, the metallic areas 14 serve indirectly for external connection since the bonding pads are conducting areas 28 connected to the metallic areas 14 by the vias 24.

Figure 2:
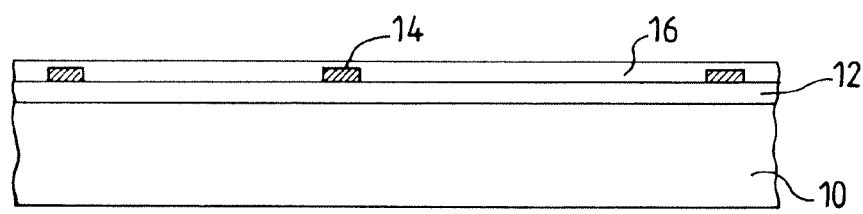
FIG. 2 shows the wafer after a planarization operation.
Figure 11:
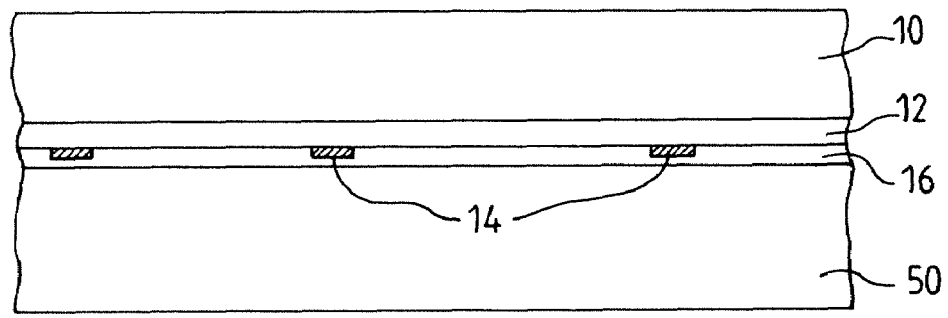
FIGS. 11 to 16 show the fabrication steps in a second embodiment of the invention.
Figure 12:
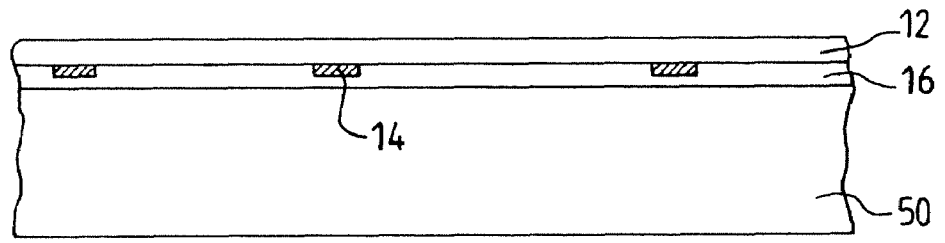
Figure 13:
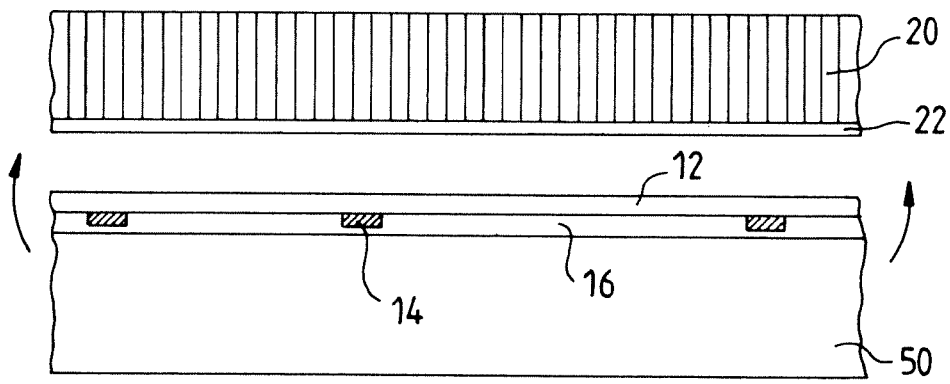

With this small difference, the fabrication starts with the wafer shown in FIG. 2, which is planarized by a silicon oxide layer 16 and polished, and then the wafer is mounted on a temporary mounting substrate 50. FIG. 11 shows the semiconductor wafer turned upside down, with its front face downward, bonded to the mounting substrate 50.

Here again, the bonding is by wafer bonding between the highly planar surfaces of the planarized wafer and of the mounting substrate.

The next step (FIG. 12) consists in thinning the wafer so as to leave only a very small thickness corresponding to only part of the thickness of the epitaxial layer 12, or possibly over the entire epitaxial layer and a very small thickness of the original semiconductor substrate 10. The final thickness of the thinned wafer is at most 30 microns and may even go down to a few microns.

Next (FIG. 13), the structure thus thinned is bonded, via the thinned rear face of the wafer, to a fiber-optic plate 20. To do this, a planarization layer (not shown) may optionally be deposited on this rear face in order to facilitate subsequent wafer bonding.

Figure 3:
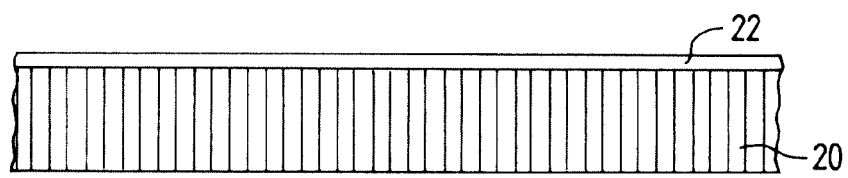
FIG. 3 shows a fiber-optic plate with its front face planarized.
Figure 4:
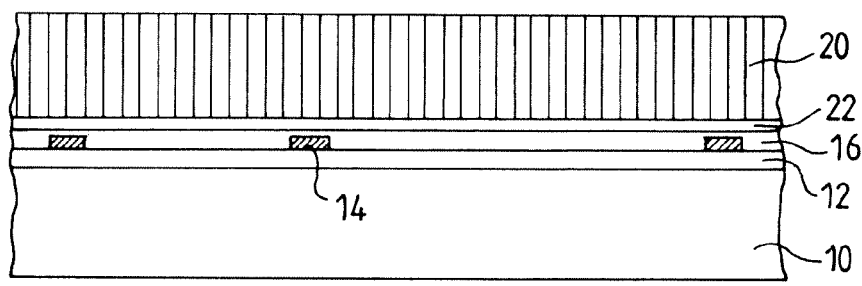
FIG. 4 shows a structure combining the wafer and the fiber plate, which are bonded face to face.

The fiber-optic plate is the same as that in FIG. 3, if necessary coated with a planarization layer 22 which, after being polished down to a very low roughness, allows wafer bonding.

Figure 14:
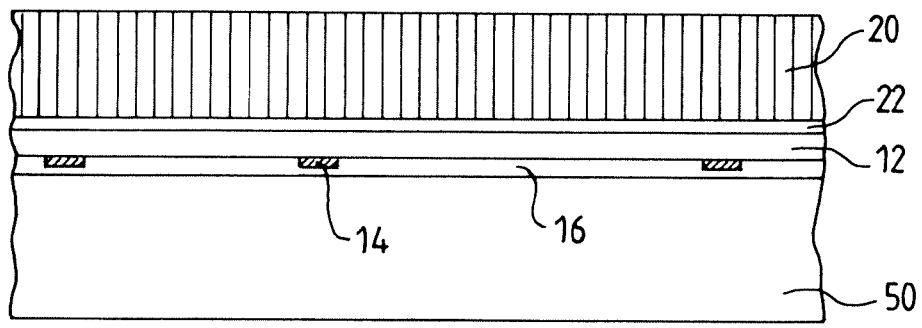

The collective structure at this stage is shown in FIG. 14, with the following stack: a temporary mounting substrate 50, a highly thinned semiconductor wafer 12 and a fiber-optic plate 20.

The next step consists in removing the temporary mounting substrate 50. This may be removed by machining, but as the substrate 50 was bonded by wafer bonding there are also specific debonding techniques using, for example, a prior surface implantation of hydrogen before bonding, in order to facilitate the subsequent debonding.

Figure 15:
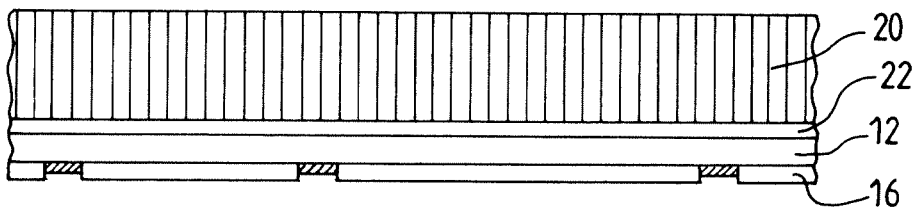
Figure 16:
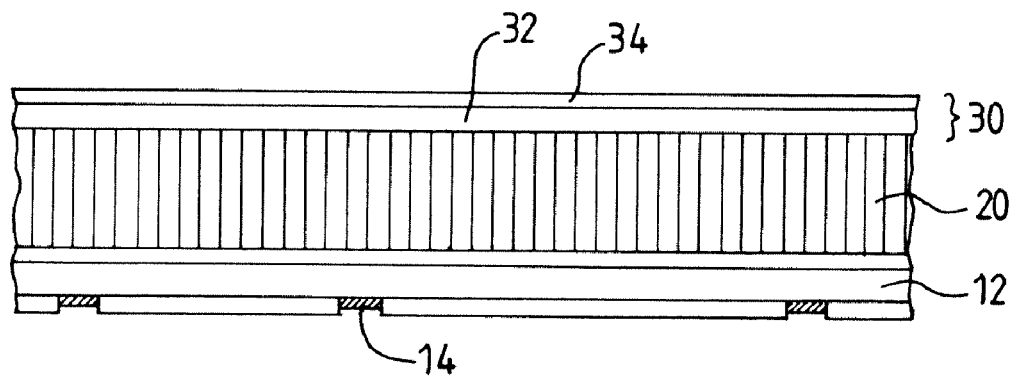

Once the debonding has been effected, an operation to bare the conducting areas 14 is carried out, these areas having to serve as bonding pads for access to the outside. This baring is performed by photolithography by opening apertures, facing these areas, in the layers that cover it, especially the layer 16 (FIG. 15).

The collective fabrication also includes placing a scintillating film on the accessible face of the fiber-optic plate (FIG. 16) in the case of a radiological sensor in which the fibers of the plate are not themselves scintillating. The scintillating film 30 is the same as in FIG. 8 and is bonded to the collective structure comprising the plate and the wafer before it is divided up into individual chips. It could be bonded before the contacts are bared, or else after the dicing into individual chips.

The collective fabrication operations are now essentially complete as regards the invention. What remains to be done is to dice the superposed fiber plate/semiconductor wafer structure into chips, each constituting an individual image sensor. The dicing is carried out from a single face of the plate/wafer assembly. The peripheral edges of the chip, the plate and the scintillator are all in exact coincidence.

Figure 17:
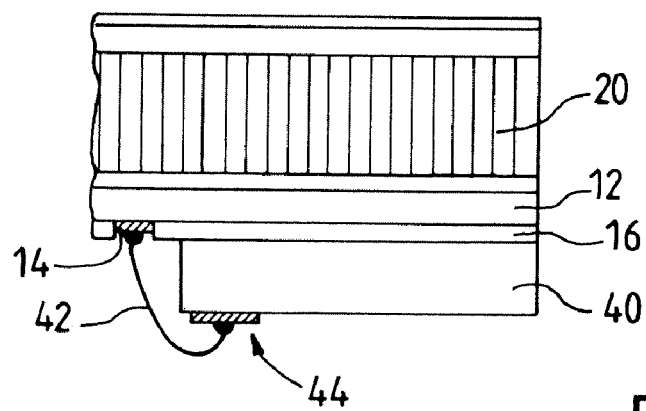
FIG. 17 shows a completed image sensor in this second embodiment.

The individual chips are each mounted on a support 40 (base of a package or printed circuit containing other components) as shown in FIG. 17.

The chip is bonded to the first face of the substrate. Connection wires 42 are wire-bonded on one side to the bared pads 14 and on the other side to the opposite face of the support 40. The chip is offset slightly, as in FIG. 9, relative to the edge of the support 40. Here again, a substantial saving in lateral footprint relative to the conventional arrangement shown in FIG. 10 is achieved, since the edge of the semiconductor wafer and the edge of the plate are superposed and the support 40 is not necessarily offset relative to the wafer and plate edges.

Here again, the sensor is mounted on the support 40 using the flip-chip (pad-to-pad bonding) technique.

The image sensor is illuminated via the rear face of the thinned semiconductor wafer, this being highly advantageous (for sensitivity within the entire visible range, and in particular in the blue), and, moreover, access to the bonding pads is particularly simple since it does not involve vias through the thickness of the thinned wafer (except if vias are useful for other reasons). However, such a construction requires a double mounting of the wafer, firstly on a temporary substrate and then on the fiber-optic plate.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A method of fabricating a dental intraoral radiological image sensor, comprising the following steps: combining a semiconductor wafer for the collective production of a structure; bearing a matrix of photosensitive detectors integrated into the wafer, and a fiber-optic plate fixed by wafer bonding, thinning the semiconductor wafer in a step subsequent to the formation of the image detection circuits on the wafer, and producing external access contact pads on that face of the wafer which is not fixed to the fiber plate, said contact pads being for controlling the circuits and for receiving image signals coming from the sensor, the fiber-optic plate having a thickness such that the fiber-optic plate provides most of the mechanical integrity of the structure once the wafer has been thinned, and does so right to the end of the collective fabrication, the assembled structure including the wafer and the plate being subsequently diced into individual chips.

2. The method as claimed in claim 1, wherein the plate and the semiconductor wafer are diced along one and the same dicing line to define the individual chips.

3. The method as claimed in claim 2, comprising the following steps:
producing a number of matrices of photosensitive zones and of associated electronic circuits from a front face of the semiconductor wafer by successive layer deposition and etching steps;
planarizing the front face of the wafer, as is also a front face of a fiber-optic plate of sufficient thickness to ensure mechanical integrity of the wafer during the rest of the fabrication thereof, before being diced into individual chips;
bonding the plate via its planarized front face to the planarized front face of the wafer, the bonding being carried out by wafer bonding without interposition of an adhesive;
removing most of the thickness of the semiconductor wafer by machining the rear face thereof;
opening vias locally in the rear face of the thinned wafer, over the entire thickness of the latter, in order to bare conducting areas preformed on the front face;
forming external contact pads, which are connected to these conducting zones through the vias, on the rear face; and
subsequently, dicing the wafer into individual chips.

4. The method as claimed in claim 1 comprising the following steps:
producing a number of matrices of photosensitive zones and of associated electronic circuits from a front face of the semiconductor wafer by successive layer deposition and etching steps;
planarizing the front face of the wafer, as is also a front face of a fiber-optic plate of sufficient thickness to ensure mechanical integrity of the wafer during the rest of the fabrication thereof, before being diced into individual chips;
bonding the plate via its planarized front face to the planarized front face of the wafer, the bonding being carried out by wafer bonding without interposition of an adhesive;
removing most of the thickness of the semiconductor wafer by machining the rear face thereof;
opening vias locally in the rear face of the thinned wafer, over the entire thickness of the latter, in order to bare conducting areas preformed on the front face;
forming external contact pads, which are connected to these conducting zones through the vias, on the rear face; and
subsequently, dicing the wafer into individual chips.

5. The method as claimed in claim 4, wherein the rear face of the semiconductor wafer of the diced chip is fixed to a front face of a support that has conducting areas on its rear face, the pads being connected to the conducting areas by wire-bonded wires.

6. The method as claimed in claim 5, wherein the rear face of the diced chip is fixed to a front face of a support having conducting areas, the pads of the wafer facing the conducting areas of the support and being provided with conducting bumps soldered directly to the conducting areas of the support.

7. The method as claimed in claim 1, comprising the following steps:
producing a number of matrices of photosensitive zones and of associated electronic circuits from a front face of the semiconductor wafer by successive layer deposition and etching steps, and also produced are external access contact areas allowing the sensor to be controlled and image signals to be received;
bonding the front face of the wafer to the front face of a temporary mounting substrate, and most of the thickness of the wafer is removed by machining the rear face of the latter;
planarizing the rear face of the thinned wafer, as is a front face of a fiber-optic plate of sufficient thickness to provide the wafer with mechanical integrity during the rest of its fabrication before being diced into individual image sensors, and the plate is bonded by its planarized front face to the planarized rear face of the wafer, the bonding being carried out by wafer bonding with no adhesive applied;
the temporary mounting substrate is removed and the external access contact areas are bared; and
subsequently, the wafer is diced into individual chips.

8. The method as claimed in claim 7, wherein the front face of the semiconductor wafer of the diced chip is fixed to a front face of a support that includes conducting areas on its rear face, and connection wires are wire-bonded between the contact areas of the wafer and the conducting areas (44) of the support.

9. The method as claimed in claim 7, wherein the front face of the diced chip is fixed to a front face of a support that includes conducting areas, the contact areas on the wafer facing the conducting areas of the support and being provided with conducting bumps soldered directly to the conducting areas of the support.

10. The method as claimed in claim 1 wherein, during the collective fabrication steps before dicing into chips, the fiber-optic plate is covered with a scintillator structure.

11. The method of claim 1, wherein wafer bonding is performed by molecular adhesion with no adhesive being applied.

12. A dental intraoral radiological image sensor, comprising a chip formed from a superposition of a fiber-optic plate and a semiconductor wafer, having a thickness smaller than the thickness of the plate and being less than 30 microns, in which wafer a matrix of photosensitive zones and associated electronic circuits are formed, the wafer being bonded to the plate by wafer bonding without adhesive being applied, the wafer having, on its face not bonded to the fiber plate, external access contact pads for controlling the sensor and for receiving image signals coming from the matrix.

13. The image sensor as claimed in claim 12, wherein the face of the semiconductor wafer which is bonded to the fiber plate is a front face of the wafer, on which face the photosensitive matrix and the electronic circuits are formed, and in that the contact pads are connected to the electronic circuits on the front face through vias open from the rear face to the front face of the wafer.

14. The image sensor as claimed in claim 13, wherein the face of the semiconductor wafer which is bonded to the plate is a rear face of the wafer, the photosensitive matrix, the electronic circuits and the contact pads all being formed on the front face of the wafer.

15. The image sensor as claimed in claim 12, wherein the peripheral edge of the plate and the peripheral edge of the semiconductor wafer are superposed so as to coincide exactly.

16. The image sensor as claimed in claim 12, wherein the chip including the superposed wafer and plate is fixed to a front face of a support, connection wires being wire-bonded between the contact pads and a rear face of the support.

17. The image sensor as claimed in claim 12, wherein the chip consisting of the superposed wafer and plate is fixed to a front face of a support, the contact pads of the wafer being bonded directly to conducting areas of the front face of the support, the conducting areas of the support facing the contact pads of the wafer.

18. The image sensor as claimed in claim 12, including a scintillating structure on a plate face not bonded to the semiconductor wafer.

19. The image sensor as claimed in claim 18, wherein the peripheral edge of the scintillating structure is superposed so as to coincide exactly with the edge of the wafer.

* * * * *